United States Patent
Wu et al.

(10) Patent No.: US 9,741,658 B2
(45) Date of Patent: Aug. 22, 2017

(54) ELECTRICAL FUSE STRUCTURE AND METHOD OF FORMATION

(71) Applicant: Taiwan Semiconductor Manufacturing Company, Ltd., Hsin-Chu (TW)

(72) Inventors: Shien-Yang Wu, Jhudong Town (TW); Wei-Chang Kung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 104 days.

(21) Appl. No.: 14/333,333

(22) Filed: Jul. 16, 2014

(65) Prior Publication Data

US 2014/0319651 A1    Oct. 30, 2014

Related U.S. Application Data

(63) Continuation-in-part of application No. 14/231,231, filed on Mar. 31, 2014, which is a continuation of application No. 12/771,768, filed on Apr. 30, 2010, now Pat. No. 8,686,536.

(60) Provisional application No. 61/256,792, filed on Oct. 30, 2009, provisional application No. 61/308,588, filed on Feb. 26, 2010.

(51) Int. Cl.
*H01L 27/08* (2006.01)
*H01L 23/525* (2006.01)
*H01L 23/522* (2006.01)

(52) U.S. Cl.
CPC ...... *H01L 23/5256* (2013.01); *H01L 23/5226* (2013.01); *H01L 2924/0002* (2013.01)

(58) Field of Classification Search
CPC ......... H01L 2924/0002; H01L 2924/00; H01L 23/5256; H01L 23/5226
See application file for complete search history.

(56) References Cited

U.S. PATENT DOCUMENTS 5,212,102 A    5/1993   Iranmanesh et al.
5,244,836 A    9/1993   Lim
(Continued)

FOREIGN PATENT DOCUMENTS

JP    2006-013338    12/2006

OTHER PUBLICATIONS

German Patent and Trademark Office, German Patent Office Action dated Oct. 17, 2016, for Application No. 10 2010 045 073.1, 6 pages.

*Primary Examiner* — Meiya Li
(74) *Attorney, Agent, or Firm* — Haynes and Boone, LLP

(57) ABSTRACT

A fuse device having contacts configured to reduce electromigration is disclosed. In some exemplary embodiments, the fuse structure includes an anode disposed at a first end and a cathode disposed at a second end. A fuse link extends between and contacts the anode and the cathode. A boundary between the fuse link and the cathode has a center point, and each connector of a plurality of cathode connectors has a center point that is an equal distance from the center point of the boundary between the fuse link and the cathode. In some such embodiments, each connector of the plurality of cathode connectors is a different size than an anode connector, whereas in some such embodiments, each connector of the plurality of cathode connectors is substantially a same size as the anode connector along at least one axis.

20 Claims, 11 Drawing Sheets

(56) References Cited

U.S. PATENT DOCUMENTS

| | | |
|---|---|---|
| 5,427,979 A | 6/1995 | Chang |
| 5,472,901 A | 12/1995 | Kapoor |
| 5,538,924 A | 7/1996 | Chen |
| 5,573,970 A | 11/1996 | Pramanik et al. |
| 5,618,750 A | 4/1997 | Fukuhara et al. |
| 5,702,982 A | 12/1997 | Lee et al. |
| 5,854,510 A | 12/1998 | Sur, Jr. et al. |
| 5,879,982 A | 3/1999 | Park et al. |
| 5,882,998 A | 3/1999 | Sur, Jr. et al. |
| 5,907,788 A | 5/1999 | Kasai |
| 5,953,635 A | 9/1999 | Andideh |
| 5,970,346 A | 10/1999 | Liaw |
| 5,989,784 A | 11/1999 | Lee et al. |
| 6,027,999 A | 2/2000 | Wong |
| 6,078,088 A | 6/2000 | Buynoski |
| 6,162,686 A | 12/2000 | Huang et al. |
| 6,242,790 B1 | 6/2001 | Tsui et al. |
| 6,277,674 B1 | 8/2001 | Wang et al. |
| 6,433,404 B1 | 8/2002 | Iyer et al. |
| 6,436,738 B1 | 8/2002 | Yu |
| 6,642,601 B2 | 11/2003 | Marshall et al. |
| 6,661,330 B1 | 12/2003 | Young |
| 6,670,824 B2 | 12/2003 | Goodbread et al. |
| 7,109,564 B2 | 9/2006 | Wu et al. |
| 7,642,176 B2 | 1/2010 | Cheng et al. |
| 2005/0189613 A1 | 9/2005 | Otsuka et al. |
| 2005/0285222 A1 | 12/2005 | Thei et al. |
| 2005/0285224 A1* | 12/2005 | Tsutsui ............... H01L 23/5256 257/531 |
| 2007/0210413 A1 | 9/2007 | Booth et al. |
| 2007/0298526 A1 | 12/2007 | Berry et al. |
| 2008/0029843 A1 | 2/2008 | Booth, Jr. et al. |
| 2008/0186788 A1 | 8/2008 | Barth |
| 2008/0211059 A1 | 9/2008 | Kwon et al. |
| 2009/0021338 A1 | 1/2009 | Kim et al. |
| 2009/0231020 A1 | 9/2009 | Kubota |
| 2009/0243032 A1 | 10/2009 | Chen |
| 2009/0261450 A1 | 10/2009 | Cheng et al. |
| 2009/0283853 A1 | 11/2009 | Huebinger |
| 2010/0090751 A1 | 4/2010 | Cheng et al. |
| 2014/0319651 A1 | 10/2014 | Wu et al. |

\* cited by examiner

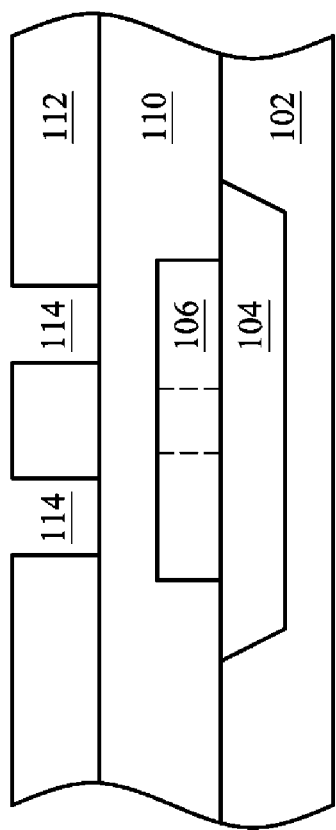
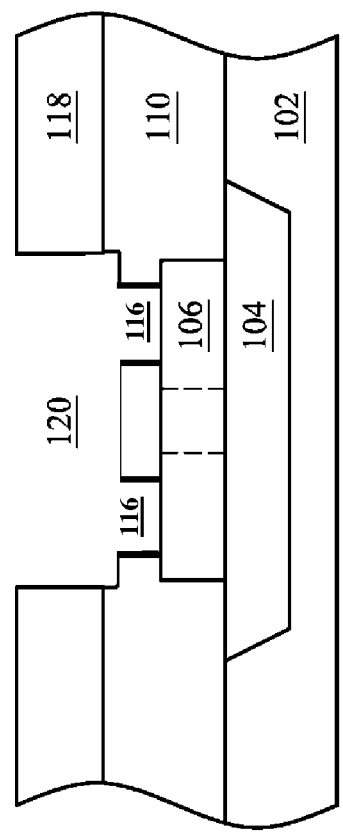
FIG. 5C
FIG. 5D

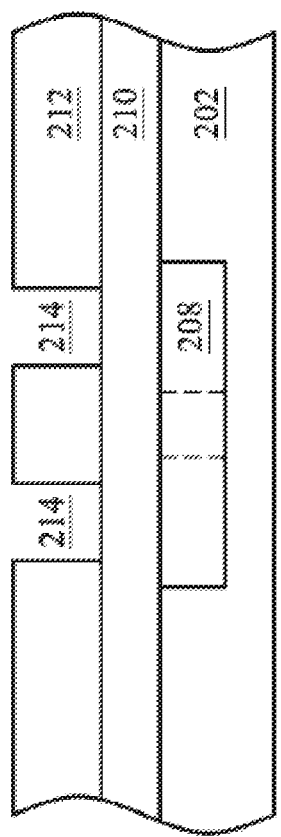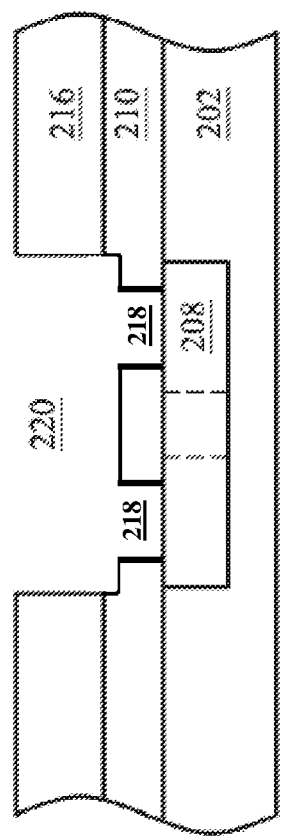

ELECTRICAL FUSE STRUCTURE AND METHOD OF FORMATION

PRIORITY DATA

The present application is a continuation-in-part of U.S. Ser. No. 14/231,231, filed on Mar. 31, 2014, entitled "Electrical Fuse Structure and Method of Formation", which is a continuation of U.S. Ser. No. 12/771,768, filed on Apr. 30, 2010, entitled "Electrical Fuse Structure and Method of Formation", now U.S. Pat. No. 8,686,536, which claims the benefit of U.S. Provisional Patent Application Ser. No. 61/256,792, filed on Oct. 30, 2009, and entitled "Electrical Fuse Structure and Method of Formation," and U.S. Provisional Patent Application Ser. No. 61/308,588, filed Feb. 26, 2010, and entitled "Electrical Fuse Structure and Method of Formation", the entire disclosure of each of which is incorporated herein by reference in its entirety.

TECHNICAL FIELD

The disclosure relates generally to a fuse structure and method of forming the fuse structure and, more particularly, to an electrical fuse in a semiconductor device and method of forming the electrical fuse.

BACKGROUND

In the semiconductor industry, fuse elements are widely used features in integrated circuits for a variety of purposes, such as in memory repair, analog resistor trimming, and chip identification. For example, by replacing defective memory cells on chips with redundant cells on the same chips, memory manufacturing yields can be significantly increased. A fuse disconnected by a laser beam is referred to as a laser fuse, and a fuse disconnected by passing an electrical current, or blowing, is referred to as an electrical fuse, or e-fuse. By selectively blowing fuses within an integrated circuit that has multiple potential uses, a generic integrated circuit design may be economically manufactured and adapted to a variety of custom uses.

E-fuses may be incorporated in the design of integrated circuits, wherein the fuses are selectively blown, for example, by passing an electrical current of a sufficient magnitude to cause electro-migration or melting of a fuse link, thereby creating a more resistive path or an open circuit. However, a contact to a cathode of a conventional fuse may cause problems when a large electrical current passes through the fuse. This contact is generally aligned with an axis of a fuse link and nearest to the fuse link and has a very small contact area. Because the contact is nearest to and aligned with the fuse link, the resistance between the fuse link and the contact is much lower than any resistance between the fuse link and any other contacts in the cathode. This low resistance may cause a large proportion of the electrical current to flow through the contact.

The larger electrical current flowing through the contact may cause electro-migration of the metal in the contact to the fuse link. The electro-migration of the metal then may cause the fuse link to short circuit again when the large electrical current was intended to create a more resistive path or open circuit. This problem is increased after a high temperature storage (HTS) or bake process of the chip. Accordingly, there is a need in the art for a more robust fuse structure to overcome the deficiencies of the prior art.

SUMMARY

In accordance with an embodiment, a fuse structure comprises an anode, a cathode, a fuse link interposed between the anode and the cathode, and cathode connectors coupled to the cathode. The cathode connectors are each equivalent to or larger than about two times a minimum feature size of a contact that couples to an active device.

In accordance with another embodiment, a fuse structure comprises an anode, a cathode with connectors coupled to the cathode, and a fuse link coupled between the cathode and the anode. A cross-section area of each of the connectors is equal to or larger than a cross-section area of a connector coupling an active device.

In accordance with a further embodiment, a fuse structure comprises a cathode, a fuse link, an anode, a dielectric over the cathode, openings in the dielectric over the cathode, and metal connectors disposed in the openings. The fuse link is coupled between the cathode and the anode. The openings expose a portion of the cathode, and a cross-sectional area parallel to a top surface of the cathode of each of the openings is greater than a minimum feature size.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 5A-F are an exemplary process to form an electrical fuse structure in accordance with an embodiment;

FIGS. 6A-F are an illustrative process to form an electrical fuse structure in accordance with a further embodiment;

DETAILED DESCRIPTION OF ILLUSTRATIVE EMBODIMENTS

The making and using of the present embodiments are discussed in detail below. It should be appreciated, however, that this disclosure provides many applicable inventive concepts that can be embodied in a wide variety of specific contexts. The specific embodiments discussed are merely illustrative of specific ways to make and use the invention, and do not limit the scope of the invention.

Embodiments will be described with respect to an electrical fuse structure in a semiconductor chip. Other embodiments contemplate applications where the use of an electrical fuse structure is desirable.

Figure 1:
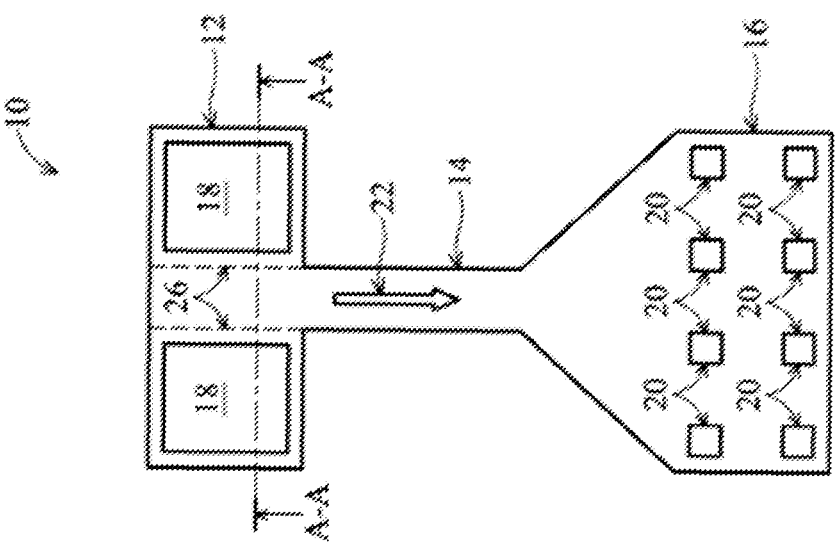
FIG. 1 is an electrical fuse structure in accordance with an embodiment.

FIG. 1 depicts a fuse structure 10 comprising a cathode 12, a fuse link 14, and an anode 16. The fuse structure 10 may be formed of a metal, such as copper or the like, or silicided polysilicon, such as nickel silicide (NiSi), titanium silicide ($TiSi_2$), cobalt silicide ($CoSi_x$), platinum silicide ($PtSi_2$), or the like. Cathode 12 has a rectangular shaped top surface and has two contacts 18 coupled to the top surface. Anode 16 has a funnel shaped top surface and has contacts 20 coupled to the top surface. The contacts 18 and 20 may comprise copper, tungsten, or metals of the like, and may also comprise a diffusion barrier layer lining the contacts 18 and 20 comprising, for example, TiN, TaN, or the like. The fuse link 14 has a width (perpendicular to arrow 22) much smaller than the width of the cathode 12 and the anode 16. Although the description herein refers to contacts 18 and 20, these contacts may be vias and/or contacts.

Contacts 18 in the cathode 12 couple a larger surface area of the top surface of the cathode 12 than contacts coupling active devices in other portions of the chip, such as to a transistor gate, and the contacts 18 do not align or intersect a longitudinal axis through the fuse link 14 that is represented by the arrow 22. For example, dashed lines 26 illustrate longitudinal axes along edges of the fuse link 14 that define an area in the cathode 12 to which no contacts couple.

As a further exemplary embodiment and to further illustrate the embodiment in FIG. 1, examples of dimensions will be described with respect to a technology node of 32 nm, but the dimensions are not limiting with regard to embodiments described herein. One of ordinary skill in the art will appreciate that the dimensions may be varied according to different technology nodes. In an embodiment in a 32 nm technology node device, the contacts 20 in the anode 16 may be a contact or via, and may have a surface area width of about 40 nm and a length of about 40 nm. Thus, the area of contacts 20 may be square. The contacts 20 are said to be of a minimum feature size, which corresponds to the technology node of the embodiment, such as for gate electrodes, contacts, or metal lines. For example, a contact size may have a critical dimension of between about 15 nm and about 40 nm, and a via size may have a critical dimension of between about 20 nm and about 50 nm, each for a technology node of 32 nm. Thus, the contacts 20 may be equal to or larger than about the minimum feature size of a contact that couples an active device in another portion of the chip, such as to a transistor gate, or further, may be between about one times to about two times the minimum feature size of a contact that couples an active device in another portion of the chip. Minimum feature sizes for different technology nodes will have different critical dimensions.

The fuse link 14 may have a length of approximately 240 nm and a width of between about 40 nm and about 60 nm. Thus, the fuse link 14 width may be equivalent to or larger than about the minimum feature size of a gate electrode, or further, may be between about one times and about two times the minimum feature size of a gate electrode. Alternatively, the fuse link 14 width may be equivalent to or larger than about the minimum feature size of a width of a metal line, or further, may be between about one times and about two times the minimum feature size of the width of the metal line. The contacts 18 in the cathode 12 may have a surface area width of about 120 nm and a length of about 120 nm. Thus, the area of contacts 18 may be square, and may be equal to or greater than about two times the minimum feature size of a contact that couples an active device in another portion of the chip, or further, may range from about two times to about four times the minimum feature size of a contact coupling an active device. These dimensions may be varied according to, for example, a different technology node or according to different desires and needs of a design.

The arrow 22 also represents the direction of the flow of electrons when an electrical current is applied to the fuse structure 10. Thus, as is readily apparent to a person having ordinary skill in the art, the contacts 18 are equidistant from the fuse link 14 such that the resistances between the fuse link 14 and each of the contacts 18 may also be equal. The equal resistances may cause the current flowing through the fuse link 14 to be substantially evenly proportioned between each contact 18. This may reduce a large current that may be isolated to a single contact of the prior art. Further, the contact areas of the contacts 18 are substantially larger such that the current density in a single contact 18 may be reduced when an electrical current is applied to the fuse structure. The reduced magnitude of current and current density flowing through any single contact 18 generally causes the fuse structure to have a more robust electro-migration capability such that the metal in or above the contacts 18 are generally less likely to migrate to the fuse link 14 and short the fuse structure 10.

Figure 2:
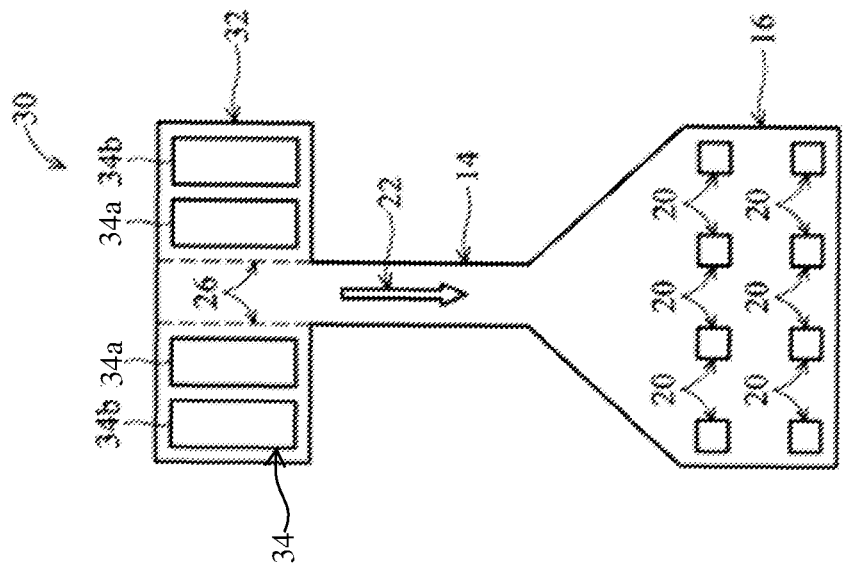
FIG. 2 is an electrical fuse structure in accordance with another embodiment.
Figure 3:
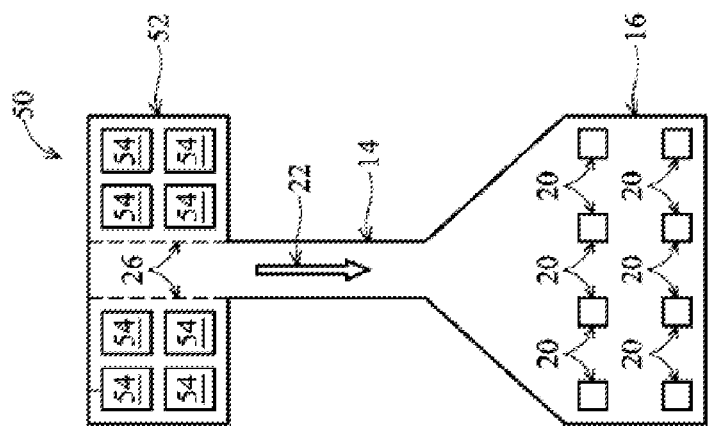
FIG. 3 is an electrical fuse structure in accordance with a further embodiment.
Figure 4:
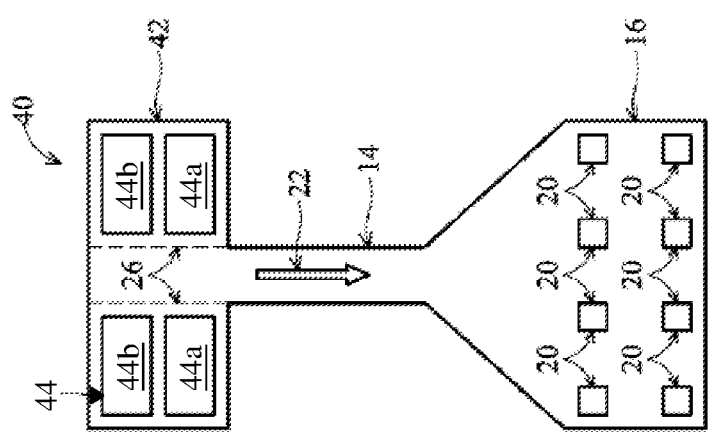
FIG. 4 is an electrical fuse structure in accordance with an additional embodiment.

FIGS. 2 through 4 illustrate further embodiments. The embodiments in FIGS. 2 through 4 may be desirable when more contacts are needed for redundancy. FIG. 2 illustrates a fuse structure 30 comprising a cathode 32. The cathode 32 comprises a one-by-four array of inner and outer contacts 34a and 34b, respectively, which are referred to collectively as the contacts 34, which may also be vias. The contacts 34 again are not aligned with the fuse link 14 but are offset from the longitudinal axis of the fuse link. The inner contacts 34a are equidistant from a longitudinal axis of the fuse link 14, or from the area defined by dashed lines 26, and outer contacts 34b are equidistant from the longitudinal axis. The contacts 34 have a contact surface area that is larger. The contacts 34 may each be approximately 120 nm in length and about 60 nm in width, although other dimensions may be used.

FIG. 3 illustrates a fuse structure 40 comprising a cathode 42. The cathode 42 comprises a two-by-two array of contacts 44 (which are further designated as contacts 44a and contacts 44b), which may also be vias. The contacts 44 again are not aligned with the fuse link 14 and have a relatively larger contact surface area. The two contacts 44a-44 more proximate the fuse link 14 are equidistant from a longitudinal axis of the fuse link 14, and the two contacts 44b furthest from the fuse link 14 are equidistant from the longitudinal axis. The contacts may each be approximately 60 nm in length and about 120 nm in width, but other dimensions are contemplated within scopes of this embodiment.

FIG. 4 illustrates a fuse structure 50 comprising a cathode 52. The cathode 52 comprises a two-by-four array of contacts 54, which may also be vias. The contacts 54 are likewise not aligned with the fuse link 14 and have a relatively larger contact surface area. Pairs of corresponding contacts 54 are equidistant from a longitudinal axis of the fuse link 14. Contacts 54 are symmetrically arranged on opposing sides of the longitudinal axis of the fuse link 14. The contacts 54 may each be approximately 60 nm in length and about 60 nm in width, but the dimensions may be varied.

Figure 5A:
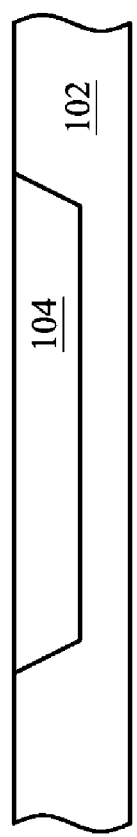

FIGS. 5A through 5F illustrate an exemplary method to form a fuse structure in accordance with embodiments. These figures illustrate a cross-section of a cathode of the fuse structure, for example, the cathode 12 in FIG. 1 along line A-A. In FIG. 5A, a semiconductor substrate 102 is provided, such as silicon, silicon-germanium, or the like. A recess is etched in the semiconductor substrate 102, and a dielectric is formed in the recess to create a shallow trench isolation (STI) 104. The dielectric may be formed by oxidizing the semiconductor substrate 102, by depositing the dielectric over the semiconductor substrate 102, or similar techniques.

Figure 5B:
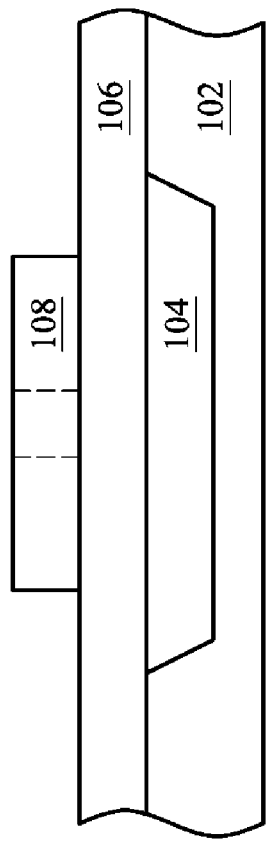

In FIG. 5B, a metal or polysilicon layer 106 is formed over the semiconductor substrate 102, such as by a blanket deposition. If metal is used, the metal layer 106 may comprise copper or the like. A photoresist 108 is then formed above the metal or polysilicon layer 106 that is above the STI 104. The top surface of the photoresist 108 is patterned similar to the top surface illustrated in FIGS. 1 through 4. The dashed lines in the photoresist 108 indicate the width of a fuse link in the subsequent fuse structure.

In FIG. 5C, an etch process is carried out such that the pattern of the photoresist 108 is imposed on the metal or polysilicon layer 106. The dashed lines in the metal or polysilicon layer 106 show the width of a fuse link coupled to the cathode. If polysilicon is used in the metal or polysilicon layer 106, the polysilicon then may be silicided by depositing a metal, such as titanium, cobalt, nickel, platinum, or the like, and annealing the structure to create titanium silicide, cobalt silicide, nickel silicide, platinum silicide, or other similar silicides. Then, a dielectric layer 110, such as an interlayer dielectric (ILD), is deposited over the semiconductor substrate 102. A photoresist 112 is deposited over the dielectric layer 110 and patterned to expose portions of the dielectric layer 110 over the remaining metal or polysilicon layer 106 through openings 114.

In FIG. 5D, an etch process is carried out to impose the pattern of openings 114 into the dielectric layer 110 to form openings 116. Another photoresist 118 is then formed over the dielectric layer 110 with an opening 120 patterned therein. An isotropic etch is then carried out to form an opening in the dielectric layer 110 so that contacts subsequently formed in openings 116 are coupled together. This process thus describes the use of a dual damascene process. However, embodiments are not limited to this process, and a person having ordinary skill in the art will readily understand the efficacy of a single damascene process or other like processes.

Figure 5E:
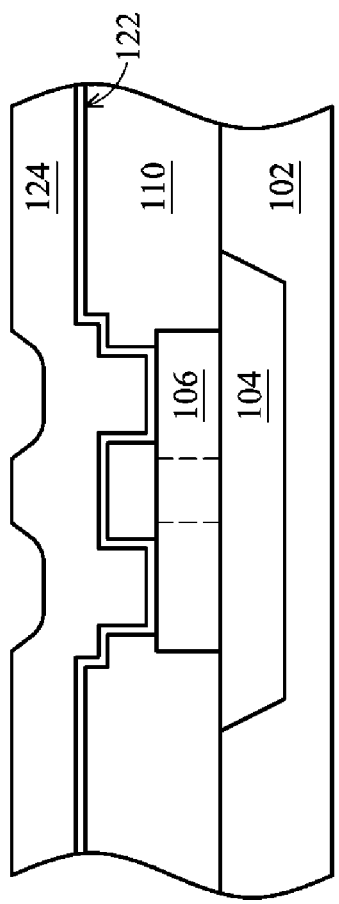

In FIG. 5E, a conformal diffusion barrier layer 122 is deposited over the structure and a metal 124 is deposited over the diffusion barrier layer 122. The diffusion barrier layer 122 may be any known barrier layer, such as titanium nitride, tantalum nitride, or the like. The metal 124 may be copper, tungsten, or the like.

Figure 5F:
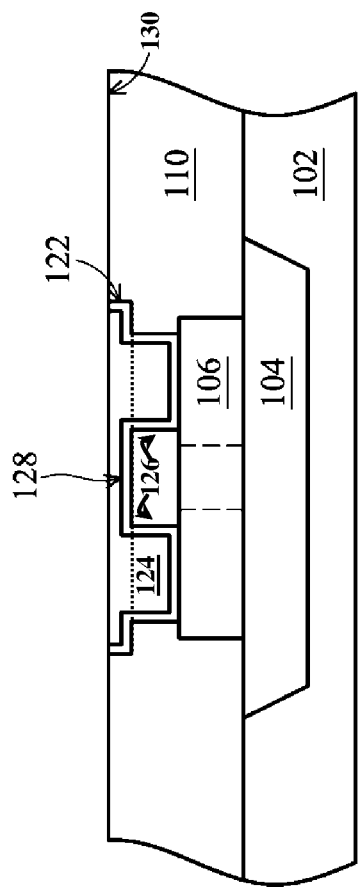

In FIG. 5F, excess metal 124 is removed, and diffusion barrier layer 122 over the dielectric layer 110 that is not within any of the formed openings is removed, such as by a chemical mechanical polish (CMP). Accordingly, contacts 126 are formed coupling the metal or polysilicon layer 106 that is the cathode, and line 128 couples the contacts 126 together and forms an area to which vias in subsequent intermetal dielectric (IMD) layers may be coupled. The contacts 126 thus formed have a larger contact area and are not aligned with any fuse link, as indicated by the dashed lines. This process may result in the layout of the fuse structure 10 as illustrated in FIG. 1, though it is noted that line 128 is not depicted in FIG. 1. A person having ordinary skill in the art will readily understand any needed modifications to this process to form other embodiments, such as those in FIGS. 2 through 4.

Figure 6A:
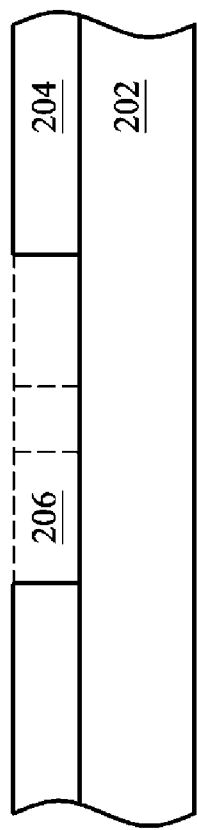

FIGS. 6A through 6F illustrate another exemplary method to form a fuse structure in accordance with embodiments. These figures illustrate a cross-section of a cathode of the fuse structure, for example, the cathode 12 in FIG. 1 along line A-A. In FIG. 6A, a first dielectric layer 202 is provided, such as silicon dioxide, silicon nitride, silicon oxynitride, or the like. The first dielectric layer 202 may be formed above a semiconductor substrate, such as part of an interlayer dielectric (ILD) or intermetal dielectric (IMD) layer in a semiconductor chip. A photoresist 204 is patterned over the first dielectric layer 202 with opening 206 therein. The opening 206 is patterned similar to the top surface illustrated in FIGS. 1 through 4. The vertical dashed lines in the photoresist 204 indicate the width of a fuse link in the subsequent fuse structure, and the horizontal dashed lines show the top surface of the photoresist 204 around other areas of opening 206.

Figure 6B:
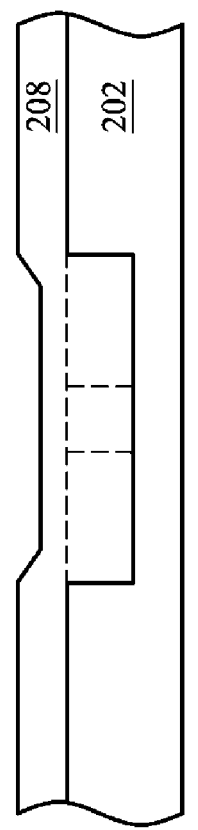

In FIG. 6B, the first dielectric layer 202 is etched such that opening 206 is imposed into the dielectric layer 202. A metal or polysilicon layer 208 is formed over the first dielectric layer 202, such as by a blanket deposition. If metal is used, the metal layer 208 may comprise copper or the like. Any excess metal or polysilicon is then removed, such as by a chemical mechanical polish (CMP). If polysilicon is used as a polysilicon layer 208, a metal, such as titanium, cobalt, nickel, platinum, or the like, may be deposited over the polysilicon and annealed to form a silicide, such as titanium silicide, cobalt silicide, nickel silicide, platinum silicide, or other similar silicides.

In FIG. 6C, a second dielectric layer 210 is deposited over the first dielectric layer 202 and the metal or polysilicon 208. The second dielectric layer 210 may be a subsequent ILD or IMD layer. A photoresist 212 is deposited over the second dielectric layer 210 and patterned to expose portions of the dielectric layer 210 over the remaining metal or polysilicon layer 208 through openings 214.

In FIG. 6D, an etch process is carried out to impose the pattern of openings 214 into the second dielectric layer 210 to form openings 218. Another photoresist 216 is then formed over the second dielectric layer 210 with an opening 220 patterned therein. An isotropic etch is then carried out to form an opening in the second dielectric layer 210 so that contacts subsequently formed in openings 218 are coupled together. This process thus describes the use of a dual damascene process. However, embodiments are not limited to this process, and a person having ordinary skill in the art will readily understand the efficacy of a single damascene process or other like processes.

Figure 6E:
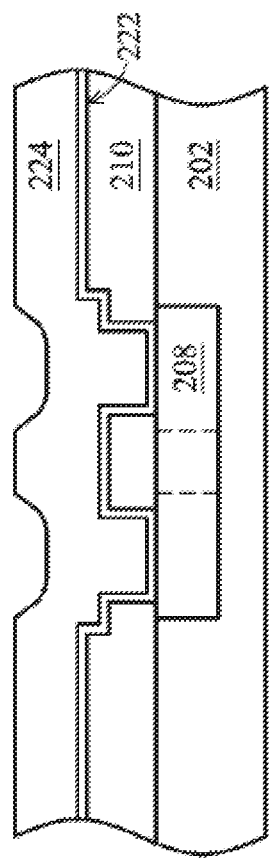

In FIG. 6E, a conformal diffusion barrier layer 222 is deposited over the structure and a metal 224 is deposited over the diffusion barrier layer 222. The diffusion barrier layer 222 may be any known barrier layer, such as titanium nitride, tantalum nitride, or the like. The metal 224 may be copper, tungsten, or the like.

Figure 6F:
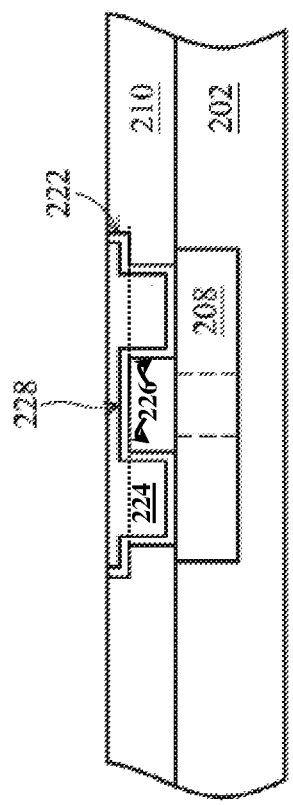

In FIG. 6F, excess metal 224 is removed, and diffusion barrier layer 222 over the second dielectric layer 210 that is not within any of the formed openings is removed, such as by a chemical mechanical polish (CMP). Accordingly, vias 226 are formed coupled to the metal or polysilicon layer 206 that is the cathode, and line 228 couples the vias 226 together and forms an area to which vias in subsequent IMD layers may be coupled. The vias 226 thus formed have a larger contact area and are not aligned with any fuse link, as indicated by the dashed lines. This process may result in the layout of the fuse structure 10 illustrated in FIG. 1, though it is noted that line 228 is not depicted in FIG. 1. A person having ordinary skill in the art will readily understand any needed modifications to this process to form other embodiments, such as those in FIGS. 2 through 4.

Further exemplary embodiments that apply the principles of the present disclosure are disclosed with respect to FIGS. 7-12. The fuse structures illustrated therein apply these principles to provide reduced electro-migration and greater reliability.

Figure 7:
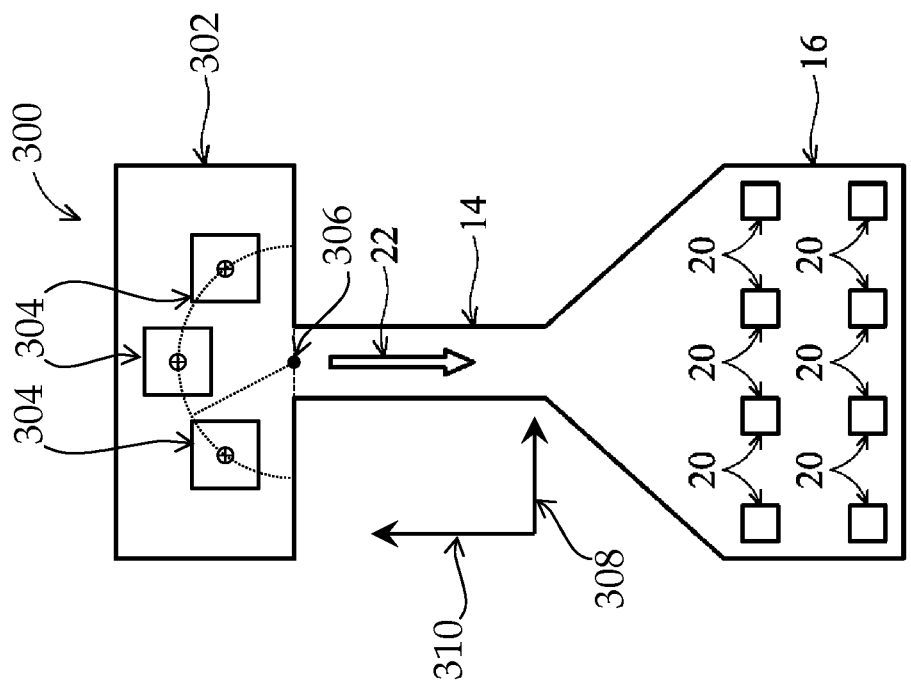
FIG. 7 is an electrical fuse structure that includes cathode contacts arranged an equal distance from the center of a fuse link in accordance with an embodiment.

Referring first to FIG. 7, the illustrated fuse structure 300 is similar in some regards to fuse structure 10 of FIG. 1 in that the cathode contacts are spaced substantially equidistant from the center of the fuse link 14. By arranging the contacts at an equal distance, the resistive paths from the contacts to the fuse link 14 are made substantially similar, which equalizes the current flowing through the cathode contacts. As described above, equalizing the current through the cathode contacts reduces the chance that a disproportionately large current through a single contact will cause electro-migration of conductive material to recouple a severed fuse link 14.

The exemplary fuse structure 300 includes a conductive material such as a metal (e.g., copper), polysilicon, a silicided polysilicon (e.g., nickel silicide, titanium silicide, cobalt silicide, platinum silicide, etc.), other suitable conductors, and/or combinations thereof. The conductive material has a cathode 302 defined at one end and an anode 16 defined at an opposite end. A fuse link 14 extends between and electrically couples the cathode 302 and the anode 16 when in an unblown state. The fuse link 14 and the anode 16 may be substantially similar to the fuse link 14 and anode 16 described with reference to FIGS. 1-4 and will only be described briefly. In the illustrated embodiment, the fuse link 14 includes a segment of the conductive material having a rectangular top surface. The width of the fuse link 14 (perpendicular to arrow 22 indicating the direction of current flow) may be smaller than the width of the cathode 302 and the anode 16 so that current flowing through the structure is concentrated in the fuse link 14. When a programming voltage is applied to the fuse structure 300, the current flowing through and concentrated by the fuse link 14 damages it, producing a discontinuity between the cathode 302 and the anode 16. In the example, the anode 16 includes a first region with a funnel-shaped top surface of the conductive material defined by a tapered portion physically contacting the fuse link 14 and a second region with a rectangular-shaped top surface opposite the fuse link 14. The fuse structure 300 includes one or more anode contacts 20 electrically coupled to the top surface of the anode 16.

Turning to the cathode 302, in the illustrated embodiment, the cathode 302 includes a region of the conductive material with a rectangular top surface. One or more cathode contacts 304 are electrically and physically coupled to the top surface. Electrical current flowing through the fuse structure 300 flows through the cathode contacts 304, through the cathode 302, through the fuse link 14 in the direction of arrow 22, and to the anode 16. Because the portion of the current flowing through a particular cathode contact 304 depends on the associated resistance, and because resistance is proportional to distance, the cathode contacts 304 are arranged an equal distance from the center of the fuse link 14. More specifically, the cathode contacts 304 are arranged such that a center point of each contact is substantially equidistant from the center point 306 of the boundary between the fuse link 14 and the cathode 302. In FIG. 7, the boundary between the fuse link 14 and the cathode 302 is shown as a dashed line. The dashed line is for reference as, in the unprogrammed state, the conductive material of the cathode 302 may extend continuously into the conductive material of the fuse link 14.

The embodiment of FIG. 7 includes three cathode contacts 304 spaced at an equal distance from the center point 306, although this number is merely exemplary. In further embodiments, the fuse structure 300 includes four or more cathode contacts 304 arranged in this manner.

In order to further reduce electro-migration, the contact areas of the cathode contacts 304 in the current embodiment are larger than that of the anode contacts 20. This reduces the current density in the cathode contacts 304 and may cause the fuse structure 300 to have a more robust electro-migration capability. In other words, the metal in or above the contacts 304 is generally less likely to migrate to the fuse link 14 and short the fuse structure 300. In that regard, the cathode contacts 304 are larger than the anode contacts 20 along both a first direction (indicated by axis 308) and a second direction (indicated by axis 310) perpendicular to the first direction. In an example, the cathode contacts 304 may each have a cross-sectional area between about two and about four times the cross-sectional area of an anode contact 20. In contrast, the anode contacts 20 may be between about one times and about two times the minimum contact feature size in the example.

However because of the complexity of fabricating minute devices, many process parameters are optimized for particular device sizes. Accordingly, in some fabrication processes, steps such as etching are tuned for a single contact size or aspect ratio. In one example, a fabrication technique is configured to produce a substantially square contact 15 nm wide (along axis 308) and 15 nm long (along axis 310). Due to etch biasing and other real-world effects, a fabrication process optimized to reliably form contacts of a first size may exhibit yield problems when forming contacts of a second size, even if the second size is larger than the first.

Figure 8:
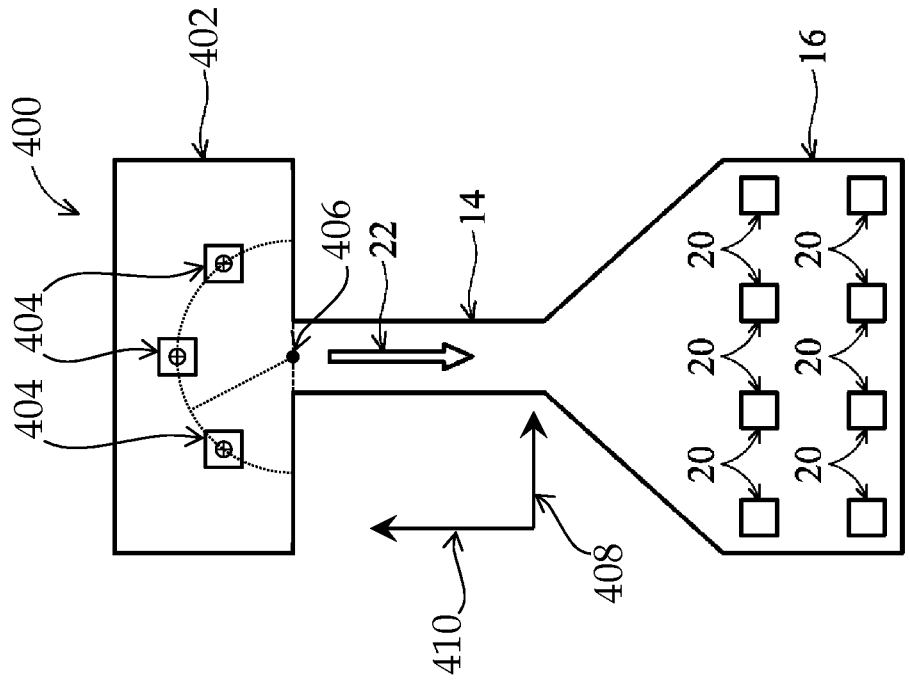
FIG. 8 is an electrical fuse structure that includes cathode contacts arranged an equal distance from the center of a fuse link in accordance with a further embodiment.

Referring to FIG. 8, a fuse structure 400 is disclosed that includes cathode contacts configured to be substantially the same size as the anode contacts in at least one dimension in order to reduce these fabrication irregularities and others. Similar to the fuse structure 300 of FIG. 7, the cathode contacts are spaced substantially equidistant from the center of the fuse link 14. By arranging the contacts at an equal distance, the resistive paths from the contacts to the fuse link 14 are substantially similar, and the likelihood of a disproportionately large current through a single contact and the associated electro-migration is reduced.

In many aspects, the fuse structure 400 of FIG. 8 is substantially similar to the fuse structure 300 of FIG. 7. For example, fuse structure 400 includes a conductive material with a cathode 402 defined at one end, an anode 16 defined at an opposite end, and a fuse link 14 extending between and electrically coupling the cathode 402 and the anode 16 when in an unblown state. The fuse link 14 and the anode 16 may be substantially similar to the fuse link 14 and anode 16 described with reference to FIG. 7. For example, in the illustrated embodiment, the fuse link 14 includes a segment of the conductive material having a rectangular top surface with a width (perpendicular to arrow 22 indicating the direction of current flow) that is smaller than the width of the cathode 402 and the anode 16. In the example, the anode 16 includes a first region with a funnel-shaped top surface of the conductive material defined by a tapered portion physically contacting the fuse link 14 and a second region with a rectangular-shaped top surface opposite the fuse link 14. The fuse structure 400 includes one or more anode contacts 20 electrically coupled to the top surface of the anode 16.

With respect to the cathode 402, it includes a region of the conductive material having a substantially rectangular top surface and one or more cathode contacts 404 electrically and physically coupled to the top surface. The cathode contacts 404 are arranged so that a center point of each contact is substantially equidistant from a center point of the boundary between the fuse link 14 and the cathode 402 (indicated by marker 406). In the illustrated embodiment, the cathode 402 includes three cathode contacts 404 positioned at this spacing, although this number is merely exemplary. In further embodiments, the cathode 402 includes other numbers of cathode contacts 404. Because resistance is proportional to distance and because current through a cathode contact 404 depends on the associated resistance, the equidistant spacing reduces the chance of a particular cathode contact 404 experiencing a disproportionate current load.

In various embodiments, the cathode contacts 404 are the same size as the anode contacts 20 in one or more directions, (e.g., along axis 408 and/or axis 410), particularly where the fabrication environment has been optimized for a size of an anode contact 20. In one such embodiment, the cathode contacts 404 have the same width as the anode contacts 20 along axis 408 and a different length from the anode contacts 20 along axis 410. In a further such embodiment, the cathode contacts 404 have the same length as the anode contacts 20 along axis 410 and a different width from the anode contacts 20 along axis 408. In yet a further such embodiment, the cathode contacts 404 have the same width as the anode contacts 20 along axis 408 and the same length as the anode contacts 20 along axis 410. By selecting from these embodiments, a designer may choose a cathode contact 404 configuration that provides an optimal balance of current density, electro-migration resistance, and ease of fabrication.

Figure 9:
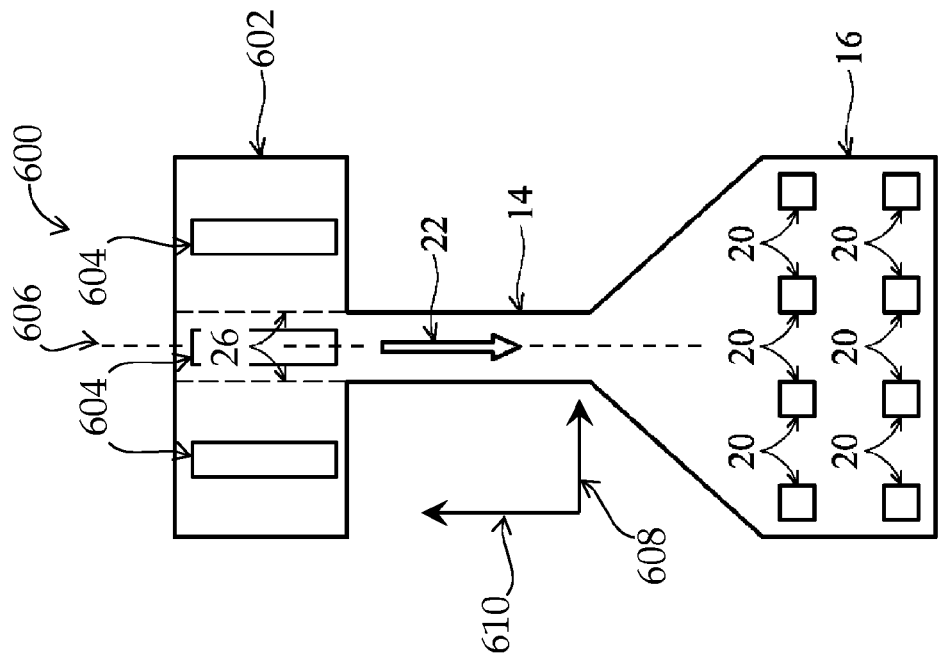
FIG. 9 is an electrical fuse structure that includes a cathode contact and an anode contact that are the same size in at least one dimension in accordance with an embodiment.

Referring to FIG. 9, an alternate fuse structure 500 is disclosed that includes cathode contacts that are the same size as the anode contacts in at least one dimension in order to reduce fabrication irregularities. Similar to the fuse structures of FIGS. 1-4, the cathode contacts are spaced away from a contact free region as wide as the fuse link 14 and extending completely through the cathode.

In many aspects, the fuse structure 500 of FIG. 9 is substantially similar to the fuse structures of FIGS. 1-4. For example, fuse structure 500 includes a conductive material with a cathode 502 defined at one end, an anode 16 defined at an opposite end, and a fuse link 14 extending between and electrically coupling the cathode 502 and the anode 16 when in an unblown state. The fuse link 14 and the anode 16 may be substantially similar to the fuse link 14 and anode 16 described with reference to FIGS. 1-4. For example, in the illustrated embodiment, the fuse link 14 includes a segment of the conductive material having a rectangular top surface with a width (perpendicular to arrow 22 indicating the direction of current flow) that is smaller than the width of the cathode 502 and the anode 16. In the example, the anode 16 includes a first region with a funnel-shaped top surface of the conductive material defined by a tapered portion physically contacting the fuse link 14 and a second region with a rectangular-shaped top surface opposite the fuse link 14. The fuse structure 500 includes one or more anode contacts 20 electrically coupled to the top surface of the anode 16.

With respect to the cathode 502, it includes a region of the conductive material having a substantially rectangular top surface, and one or more cathode contacts 504 electrically and physically coupled to the top surface. An exemplary cathode 502 comprises a one-by-four array of cathode contacts 504, although this number of cathode contacts 504 is merely exemplary. The cathode contacts 504 are positioned outside a region of the cathode 502 defined by longitudinal axes along the edges of the fuse link 14 (represented by dashed lines 26) and extending completely through the cathode region 502. In this way, the contacts 504 are not aligned with the fuse link 14 but instead are offset from the longitudinal axis of the fuse link. The cathode contacts 504 may be arranged to be symmetrical with respect to the centerline (represented by dashed line 506) of the fuse link 14.

In various embodiments, the cathode contacts 504 are the same size as the anode contacts 20 in one or more directions, (e.g., along axis 508 and/or axis 510), particularly where the fabrication environment has been optimized for a size of an anode contact 20. In the illustrated embodiment, the cathode contacts 504 have the same width as the anode contacts 20 along axis 508 and a different length from the anode contacts 20 along axis 510. For example, the cathode contacts 504 may be larger than the anode contacts 20 along axis 510 to reduce current density and thereby reduce electro-migration. In various such examples, the cathode contacts 504 each have a cross-sectional area between about two and about four times the cross-sectional area of an anode contact 20. In another such embodiment, the cathode contacts 504 have the same length as the anode contacts 20 along axis 510 and a different width from the anode contacts 20 along axis 508. In a further such embodiment, the cathode contacts 504 have the same width as the anode contacts 20 along axis 508 and the same length as the anode contacts 20 along axis 510. By selecting from these embodiments, a designer may choose a cathode contact 504 configuration that provides an optimal balance of current density, electro-migration resistance, and ease of fabrication.

Figure 10:
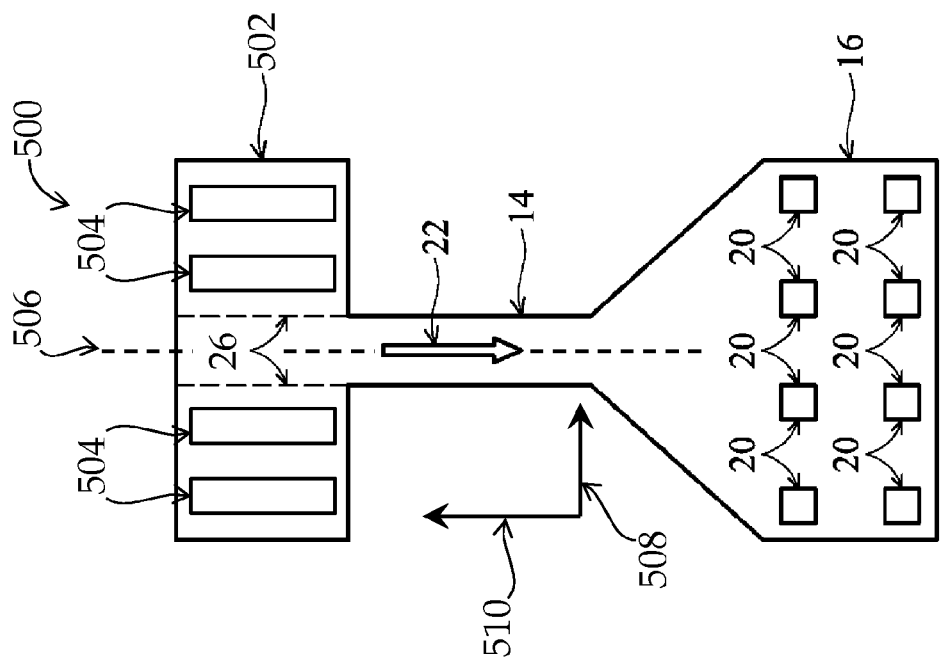
FIG. 10 is an electrical fuse structure that includes a cathode contact and an anode contact that are the same size in at least one dimension in accordance with a further embodiment.

Referring to FIG. 10, yet another fuse structure 600 is disclosed that includes cathode contacts that are the same size as the anode contacts in at least one dimension in order to reduce fabrication irregularities. In many aspects, the fuse structure 600 of FIG. 10 is substantially similar to the fuse structures of FIGS. 1-4. For example, fuse structure 600 includes a conductive material with a cathode 602 defined at one end, an anode 16 defined at an opposite end, and a fuse link 14 extending between and electrically coupling the cathode 602 and the anode 16 when in an unblown state. The fuse link 14 and the anode 16 may be substantially similar to the fuse link 14 and anode 16 described with reference to FIGS. 1-4. For example, in the illustrated embodiment, the fuse link 14 includes a segment of the conductive material having a rectangular top surface with a width (perpendicular to arrow 22 indicating the direction of current flow) that is smaller than the width of the cathode 602 and the anode 16. In the example, the anode 16 includes a first region with a funnel-shaped top surface of the conductive material defined by a tapered portion physically contacting the fuse link 14 and a second region with a rectangular-shaped top surface opposite the fuse link 14. The fuse structure 600 includes one or more anode contacts 20 electrically coupled to the top surface of the anode 16.

With respect to the cathode 602, it includes a region of the conductive material having a substantially rectangular top surface and one or more cathode contacts 604 electrically and physically coupled to the top surface. An exemplary cathode 602 comprises a one-by-three array of cathode contacts 604, although this number of cathode contacts 604 is merely exemplary. In order to arrange an odd number of cathode contacts 604 symmetrically with respect to the centerline (represented by dashed line 606) of the fuse link 14, one or more of the cathode contacts 604 are positioned within the region of the cathode 602 defined by longitudinal axes along the edges of the fuse link 14 (represented by dashed lines 26) that extends completely through the cathode region 602.

In various embodiments, the cathode contacts 604 are the same size as the anode contacts 20 in one or more directions, (e.g., along axis 608 and/or axis 610), particularly where the fabrication environment has been optimized for a size of an anode contact 20. In the illustrated embodiment, the cathode contacts 604 have the same width as the anode contacts 20 along axis 608 and a different length from the anode contacts 20 along axis 610. For example, the cathode contacts 604 may be larger than the anode contacts 20 along axis 610 to reduce current density and thereby reduce electro-migration. In various such examples, the cathode contacts 604 each have a cross-sectional area between about two and about four times the cross-sectional area of an anode contact 20. In another such embodiment, the cathode contacts 604 have the same length as the anode contacts 20 along axis 610 and a different width from the anode contacts 20 along axis 608. In a further such embodiment, the cathode contacts 604 have the same width as the anode contacts 20 along axis 608 and the same length as the anode contacts 20 along axis 610. By selecting from these embodiments, a designer may choose a cathode contact 604 configuration that provides an optimal balance of current density, electro-migration resistance, and ease of fabrication.

Figure 11:
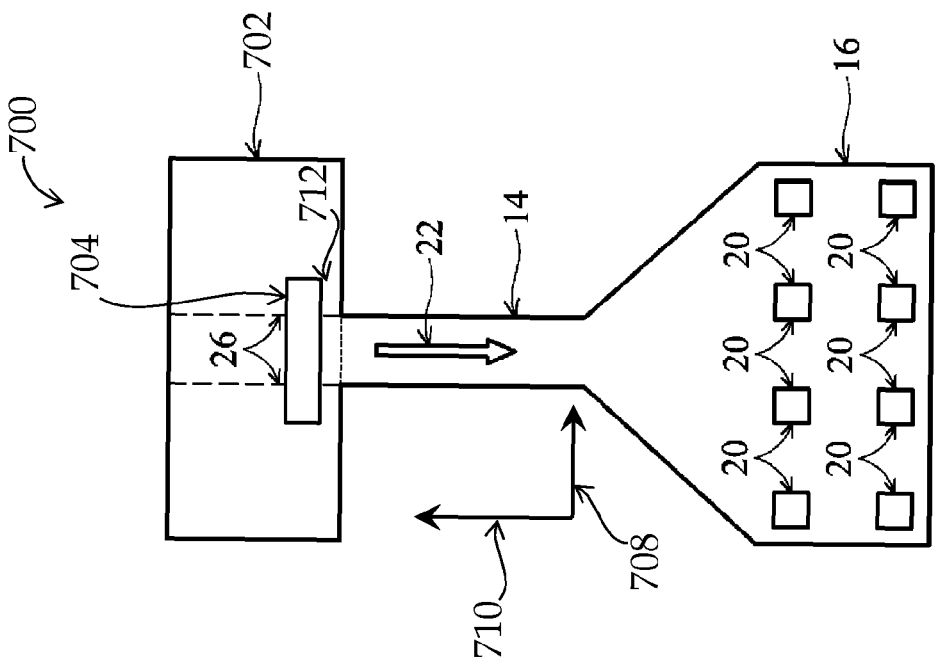
FIG. 11 is an electrical fuse structure that includes a cathode contact within a region aligned with a fuse link in accordance with an embodiment.

Referring to FIG. 11, a fuse structure 700 is disclosed that includes a cathode contact within the region aligned with the fuse link. The cathode contact extends beyond the region on two sides, and the enlarged cathode contact provides increased surface area for reduced current density and electro-migration. By extending beyond the width of the fuse link, the current density in the cathode contact may be lower than that of the fuse link. In some such embodiments, the cathode contact is the same size as the anode contacts in at least one dimension in order to reduce fabrication irregularities.

In many aspects, the fuse structure 700 of FIG. 11 is substantially similar to the fuse structures of FIGS. 1-4. For example, fuse structure 700 includes a conductive material with a cathode 702 defined at one end, an anode 16 defined at an opposite end, and a fuse link 14 extending between and electrically coupling the cathode 702 and the anode 16 when in an unblown state. The fuse link 14 and the anode 16 may be substantially similar to the fuse link 14 and anode 16 described with reference to FIGS. 1-4. For example, in the illustrated embodiment, the fuse link 14 includes a segment of the conductive material having a rectangular top surface with a width (perpendicular to arrow 22 indicating the direction of current flow) that is smaller than the width of the cathode 702 and the anode 16. In the example, the anode 16 includes a first region with a funnel-shaped top surface of the conductive material defined by a tapered portion physically contacting the fuse link 14 and a second region with a rectangular-shaped top surface opposite the fuse link 14. The fuse structure 700 includes one or more anode contacts 20 electrically coupled to the top surface of the anode 16.

With respect to the cathode 702, it includes a region of the conductive material having a substantially rectangular top surface and one or more cathode contacts 704 electrically and physically coupled to the top surface. In the illustrated embodiment, the cathode 702 comprises a one single cathode contact 704, although this number is merely exemplary. The cathode contact 704 is positioned within the region of the cathode 702 defined by longitudinal axes along the edges of the fuse link 14 (represented by dashed lines 26) that extends through the cathode region 702, and in some examples, the contact 704 extends beyond the region on two opposing sides.

In various embodiments, the cathode contact 704 is the same size as the anode contacts 20 in one or more directions, (e.g., along axis 708 and/or axis 710), particularly where the fabrication environment has been optimized for a size of the anode contact 20. In the illustrated embodiment, the cathode contact 704 has the same length as the anode contacts 20 along axis 710 and a different width from the anode contacts 20 along axis 708. For example, the cathode contact may be larger than the anode contacts 20 along axis 708 to reduce current density and thereby reduce electro-migration. In various such examples, the cathode contact 704 has a cross-sectional area between about two and about four times the cross-sectional area of an anode contact 20. In another such embodiment, the cathode contact 704 has the same width as the anode contacts 20 along axis 708 and a different length from the anode contacts 20 along axis 708. In a further such embodiment, the cathode contact 704 has the same width as the anode contacts 20 along axis 708 and the same length as the anode contacts 20 along axis 710. By selecting from these embodiments, a designer may choose a cathode contact 504 configuration that provides an optimal balance of current density, electro-migration resistance, and ease of fabrication.

Figure 12:
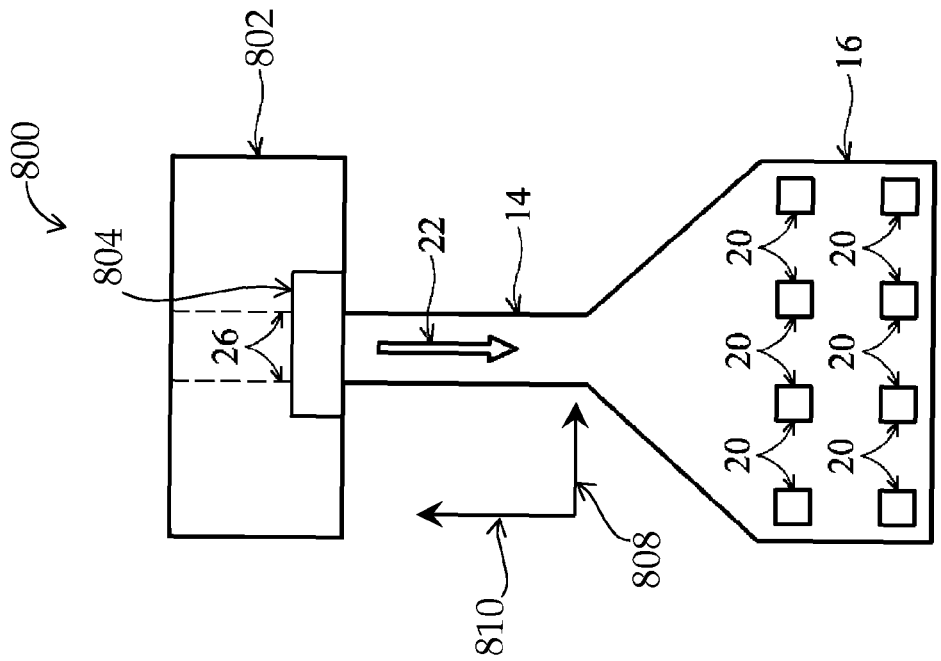
FIG. 12 is an electrical fuse structure that includes a cathode contact within a region aligned with a fuse link in accordance with a further embodiment.

The cathode contact 704 may be spaced any suitable distance from the boundary between the cathode 702 and the fuse link as indicated by reference arrow 712. Generally, positioning the cathode contact 704 further from the boundary may increase electro-migration resistance but may also increase programming voltage or programming current. FIG. 12 illustrates a particular example where the cathode contact 804 is aligned with or even extends beyond the boundary. FIG. 12 is an illustration of a fuse structure 800 that is substantially similar in many regard to fuse structure 700 of FIG. 11. For example, fuse structure 800 includes a cathode 802, an anode 16, anode contacts 20, and a fuse link 14, each substantially similar to those of FIG. 11.

The fuse structure 800 also includes a cathode contact 804 electrically and physically coupled to the top surface of the cathode 802. The cathode contact 804 is positioned within the region of the cathode 802 defined by longitudinal axes along the edges of the fuse link 14 (represented by dashed lines 26) that extends through the cathode region 802, and in some examples, the contact 804 extends beyond the region on two opposing sides. In contrast to previous examples, the contact 804 also extends to the boundary between the cathode 802 and the fuse link 14, and in some embodiments, is electrically and physically coupled to a top surface of the fuse link 14. In various embodiments, the cathode contact 804 is the same size as the anode contacts 20 in one or more directions, (e.g., along axis 808 and/or axis 810), particularly where the fabrication environment has been optimized for a size of the anode contact 20.

Thus, a fuse structure with improved electro-migration resistance and a method of forming the fuse structure are provided. In some embodiments, the electrical device includes an anode disposed at a first end and an anode connector coupled to the anode. The electrical device includes a cathode disposed at a second end and a plurality of cathode connectors coupled to the cathode. The electrical device also includes a fuse link extending between and contacting the anode and the cathode. A boundary between the fuse link and the cathode has a center point, and each connector of the plurality of cathode connectors has a center point that is an equal distance from the center point of the boundary between the fuse link and the cathode. In some such embodiments, each connector of the plurality of cathode connectors is a different size than the anode connector, whereas in some such embodiments, each connector of the plurality of cathode connectors is substantially a same size as the anode connector along at least one axis.

In further embodiments, a fuse structure is provided that includes an anode, a cathode, and a segment contacting and electrically coupling the anode and the cathode. The cathode has a substantially rectangular top surface and a plurality of cathode contacts disposed on the top surface of the cathode. A boundary of a top surface of the segment and the top surface of the cathode has a center point defined thereupon, and each cathode contact of the plurality of cathode contacts is spaced an equal distance from the center point. In some such embodiments, the plurality of cathode contacts includes at least three cathode contacts.

In yet further embodiments, a fuse structure is provided that includes an anode having an anode contact, a cathode having a cathode contact, and a fuse link extending between the anode and the cathode. The fuse link has a first edge extending along and defining a first plane and a second edge extending along and defining a second plane, and the cathode includes a region extending from the first plane to the second plane and extending from the fuse link to an edge of the cathode opposite the fuse link. The cathode contact extends within the region of the cathode from the first plane to the second plane. In some such embodiments, the cathode contact extends beyond the first plane and the second plane outside the region of the cathode.

Although these embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrical device comprising:
   an anode having an anode connector coupled thereto;
   a cathode having a plurality of cathode connectors coupled thereto; and
   a fuse link extending between and contacting the anode and the cathode,
   wherein a boundary between the fuse link and the cathode has a center point, and wherein each connector of the plurality of cathode connectors has a center point that is an equal distance from the center point of the boundary between the fuse link and the cathode.

2. The electrical device of claim 1, wherein the plurality of cathode connectors is more than two cathode connectors.

3. The electrical device of claim 1, wherein each connector of the plurality of cathode connectors has a size that is different than a size of the anode connector.

4. The electrical device of claim 1, wherein each connector of the plurality of cathode connectors has a size that is substantially the same as a size of the anode connector along an axis.

5. The electrical device of claim 4, wherein the axis is a first axis, and wherein each connector of the plurality of cathode connectors has a size that is substantially the same as a size of the anode connector along a second axis perpendicular to the first axis.

6. The electrical device of claim 1, wherein each connector of the plurality of cathode connectors has a cross-sectional area between about two times and about four times a cross-sectional area of the anode connector.

7. The electrical device of claim 1, wherein the anode connector is equivalent to or larger than a minimum contact feature size defined by a technology node of the electrical device.

8. The electrical device of claim 7, wherein the anode connector is between about one times and about two times the minimum contact feature size defined by the technology node of the electrical device.

9. A fuse structure comprising:
   an anode;
   a cathode having a substantially rectangular top surface and a plurality of cathode contacts disposed on the substantially rectangular top surface of the cathode; and
   a segment contacting and electrically coupling the anode and the cathode,
   wherein a boundary of a top surface of the segment and the substantially rectangular top surface of the cathode has a center point defined thereupon, and wherein each cathode contact of the plurality of cathode contacts is spaced an equal distance from the center point.

10. The fuse structure of claim 9, wherein the plurality of cathode contacts is at least three cathode contacts.

11. The fuse structure of claim 9, further comprising an anode contact disposed on the anode, wherein the cathode contacts of the plurality of cathode contacts each have a size that is the same as a size of the anode contact in a first dimension.

12. The fuse structure of claim 11, wherein the cathode contacts of the plurality of cathode contacts each have a size that is the same as a size of the anode contact in a second dimension perpendicular to the first dimension.

13. The fuse structure of claim 9, further comprising an anode contact disposed on the anode, wherein the cathode contacts of the plurality of cathode contacts each have a cross-sectional area that is larger than a cross-sectional area of the anode contact.

14. The fuse structure of claim 9, further comprising an anode contact disposed on the anode, wherein the cathode contacts of the plurality of cathode contacts each have a cross-sectional area that is at least two times larger than a cross-sectional area of the anode contact.

15. The fuse structure of claim 9, wherein the anode has a funnel shaped top surface disposed adjacent to the segment.

16. A fuse structure comprising:
   an anode including an anode contact;
   a cathode including at least two cathode contacts; and
   a fuse link extending between the anode and the cathode,
   wherein the fuse link has a first edge and a second edge, a width of the fuse link being defined between the first edge and the second edge, wherein the cathode includes a region defined between a first longitudinal axis extending from the first edge and a second longitudinal axis extending from the second edge, such that the region has a width the same as the width of the fuse link, and wherein one of the at least two cathode contacts is disposed within the region of the cathode, and wherein a boundary between the fuse link and the cathode has a center point, each of the at least two cathode contacts having a center point that is an equal distance from the center point of the boundary between the fuse link and the cathode.

17. The fuse structure of claim 16, wherein the one of the at least two cathode contacts disposed within the region of the cathode has a width that extends beyond the first longitudinal axis and the second longitudinal axis.

18. The fuse structure of claim 16, wherein each of the at least two cathode contacts has a size substantially the same as a size of the anode contact.

19. The fuse structure of claim 17, wherein the one of the at least two cathode contacts disposed within the region of the cathode is spaced away from the boundary between the fuse link and the cathode.

20. The fuse structure of claim 17, wherein the one of the at least two cathode contacts disposed within the region of the cathode extends to a boundary between the fuse link and the cathode.

* * * * *